United States Patent
Huang et al.

(10) Patent No.: US 9,772,384 B2
(45) Date of Patent: Sep. 26, 2017

(54) ALTERNATING CURRENT INPUT VOLTAGE DETECTING DEVICE

(71) Applicant: Chicony Power Technology Co., Ltd., New Taipei (TW)

(72) Inventors: Wen-Nan Huang, New Taipei (TW); Ming-Tsan Lin, New Taipei (TW); Ching-Guo Chen, New Taipei (TW); Shiu-Hui Lee, New Taipei (TW); Hsiao-Chih Ku, New Taipei (TW); Chih-Ming Yu, New Taipei (TW); Hsin-Chang Yu, New Taipei (TW)

(73) Assignee: Chicony Power Technology Co., Ltd., New Taipei (TW)

( * ) Notice: Subject to any disclaimer, the term of this patent is extended or adjusted under 35 U.S.C. 154(b) by 21 days.

(21) Appl. No.: 14/955,651

(22) Filed: Dec. 1, 2015

(65) Prior Publication Data

US 2017/0153295 A1    Jun. 1, 2017

(51) Int. Cl.
| | |
|---|---|
| G01R 31/00 | (2006.01) |
| G01R 31/02 | (2006.01) |
| G01R 31/08 | (2006.01) |
| G01R 31/28 | (2006.01) |
| G01R 31/42 | (2006.01) |
| G01R 31/40 | (2014.01) |
| G01R 19/00 | (2006.01) |

(52) U.S. Cl.
CPC ......... *G01R 31/40* (2013.01); *G01R 19/0084* (2013.01)

(58) Field of Classification Search
CPC ....... H02M 3/335; G01R 31/00; G01R 31/02; G01R 31/08; G01R 31/025; G01R 31/28; G01R 31/42

USPC .......................... 324/539, 764.01; 363/21.01
See application file for complete search history.

(56) References Cited

U.S. PATENT DOCUMENTS

| | | | | |
|---|---|---|---|---|
| 4,173,756 A | * | 11/1979 | Kawagai | G04C 10/04 327/217 |
| 5,063,490 A | * | 11/1991 | Maehara | H05B 41/392 363/37 |
| 7,773,353 B2 | * | 8/2010 | Uchida | B60L 3/00 361/49 |
| 2015/0333631 A1 | * | 11/2015 | Pwu | H02M 7/217 363/21.01 |

* cited by examiner

*Primary Examiner* — Son Le
*Assistant Examiner* — Neel Shah
(74) *Attorney, Agent, or Firm* — Muncy, Geissler, Olds & Lowe, P.C.

(57) ABSTRACT

An AC input voltage detecting device includes a first input, a second input, a determining unit, a first voltage-detecting unit, and a second voltage-detecting unit. The first input and the second input are electrically connected to a neutral line and a live line of an AC power, respectively. The determining unit includes a first power switch, a second power switch, and an output, the first and second power switch are electrically connected in series, and the output is coupled to the second power switch. The first voltage-detecting unit is electrically connected to the first input and the first power switch, the second voltage-detecting unit is electrically connected to the second input and the second power switch. A signal for indicating that the AC power supplies normally is generated from the determining unit while the voltages conducted by the live line and the neutral line are normal.

8 Claims, 1 Drawing Sheet

ALTERNATING CURRENT INPUT VOLTAGE DETECTING DEVICE

BACKGROUND OF THE INVENTION

Field of the Invention

The present invention relates to power detecting device, and in particular to an alternative current (AC) input voltage detecting device.

Description of Related Art

In general, the electronic products are operated when providing with a suitable and normal electric power, thereby the electronic products may be suffered when the electric power applies abnormally. In order to prevent the electronic products from suffering caused by electric power supplies abnormally, an input voltage detecting device can be arranged between the electric power and the electronic product to detect whether the electric power is abnormal or not.

Currently, the alternative current (AC) input voltage detecting device arranged between an AC power and the electronic product generates a signal for indicating that the AC power supplies abnormally to protect the electronic product form suffering only when both of the neutral voltage and the live voltage of the AC power supply abnormally. However, there is an incorrect operation caused by signal indicating that the AC power supplies normally when one of the neutral voltage and the live voltage supplies abnormally.

SUMMARY OF THE INVENTION

According to one aspect of the present disclosure, an alternating current (AC) input voltage detecting device electrically connected to an AC power includes a first input, a second input, a determining unit, a first voltage-detecting unit, and a second voltage-detecting unit. The first input is electrically connected to a neutral line of the AC power, and the second input is electrically connected to a live line of the AC power. The determining unit includes a first power switch, a second power switch, and an output, the first power switch and the second power switch are electrically connected in series, and the output is coupled to the second power switch. The first voltage-detecting unit is electrically connected to the first input and the first power switch, the second voltage-detecting unit is electrically connected to the second input and the second power switch. A signal for indicating that the AC power supplies normally is generated by the determining unit and sent from the output while a live voltage conducted by the live line and a neutral voltage conducted by the neutral line are normal.

The AC input voltage detecting device of the present invention detects the neutral voltage conducts by the neutral line and the live voltage conducts by the live line together, and generates the signal for indicating that the AC power supplies normally only when the neutral voltage and the live voltage supply normally. Thereby the incorrect operation caused by signal indicating that the AC power supplies normally when one of the neutral voltage and the live voltage supplies abnormal is effectively prevented.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

A preferred embodiment of the present invention will be described with reference to the drawings.

The present invention provides an alternating current (AC) input voltage detecting device for detecting voltages conducted by a live line and a neutral line of an AC power Vs, determines whether the voltages conducted by the live line and the neural line are abnormal or not, and outputs a signal for indicating that the AC power Vs supplies normally while the live voltage conducted by the live line and a neutral voltage conducted by the neutral line are normal.

Figure 1:
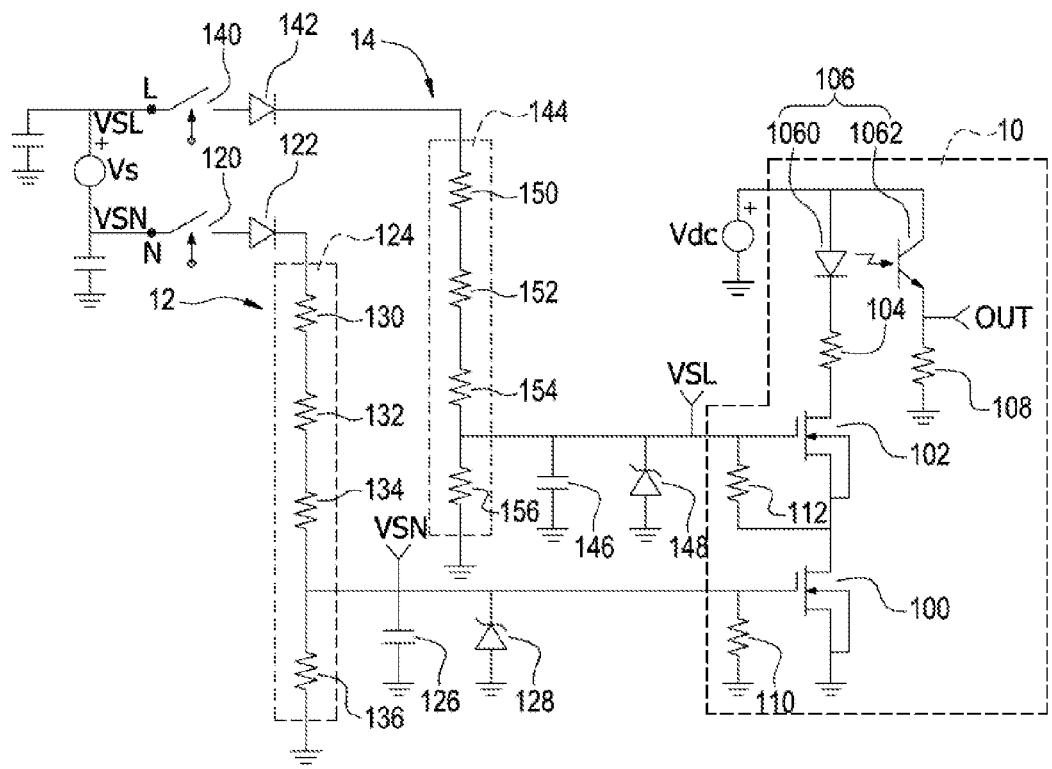
FIG. 1 is a circuit diagram of an alternating current (AC) input voltage detecting device according to the present invention.

Reference is made to FIG. 1, which a circuit diagram of the AC input voltage detecting device according to the present invention. The AC input voltage detecting device includes a first input N, a second input L, a determining unit 10, a first voltage-detecting unit 12, and a second voltage-detecting unit 14.

The first input N is electrically connected to the neutral line for conducting neutral voltage of the AC power Vs, the second input L is electrically connected to the live line L for conducting the live voltage of the AC power Vs.

The determining unit 10 includes an output OUT, a first power switch 100, and a second power switch 102, the first power switch 100 and the second power switch 102 are electrically connected in series. As can be seen in FIG. 1, the first power switch 100 and the second power switch 102 are, for example, metal-oxide-semiconductor field-effect transistors (MOSFETs). The source of the first power switch 100 is connected to ground, the gate thereof is electrically connected to the first voltage-detecting unit 12, and the drain thereof is electrically connected to the source of the second power switch 102. The gate of the second power switch 102 is electrically connected to the second voltage-detecting unit 14, and the drain thereof is electrically connected to limiting resistor 104 connected to a light emitter 1060 of the photo-coupler 106. The light emitter 1060 is, for example, a light emitting diode, the cathode of the light emitter 1060 is electrically connected to the current-limiting resistor 104, and the anode thereof is electrically connected to a direct current (DC) power Vdc. The photo-coupler 106 further includes a photodetector 1062 coupled to the light emitter 1060. The photodetector 1062 is, for example, phototransistor, and the collector of the photodetector 1062 is electrically connected to the DC power Vdc, the emitter thereof is electrically connected to the output OUT and one terminal of the current-limiting resistor 108, and the other terminal of the current-limiting resistor 108 is connected to ground.

The determining unit 10 includes resistor 110 and 112, the resistor 110 is across the gate and the source of the first power switch 100, and the second resistor 112 is across the gate and the source of the second power switch 112.

The first voltage-detecting unit 12 is arranged between the first input N and the first power switch 100 and electrically connected thereto. The first voltage-detecting unit 12 includes a first switch 120, a first current-limiting component 122, a first resistor network 124, a first capacitor 126, and a first voltage-stabilizing component 128. One terminal of the first switch 120 is electrically connected to the first input N, and the other terminal thereof is electrically connected to the first current-limiting component 122. One terminal of the first voltage-stabilizing component 128 is electrically connected to the gate of the first power switch 100, and other terminal thereof is connected to ground. The first capacitor 126 is electrically connected to the first voltage-stabilizing component 128 in parallel. The first resistor network 124 is arranged between the first current-limiting component 122 and the first voltage-stabilizing component 128 and electrically connected thereto. The first resistor network 124 includes a plurality of resistors 130-136 electrically connected in series, and the resistor 136 thereof is electrically connected to the first voltage-stabilizing component 128 in parallel. The first voltage-stabilizing component 128 is, for example, a Zener diode, and the Zener voltage (or called breakdown voltage) of the first voltage-stabilizing component 128 is equal to or higher than the conducting voltage (the gate to source voltage) of the first power switch 100.

The second voltage-detecting unit 14 is arranged between the second input L and the second power switch 102 and electrically connected thereto. The second voltage-detecting unit 14 includes a second switch 140, a second current-limiting component 142, a second resistor network 144, a second capacitor 146, and a second voltage-stabilizing component 148. One terminal of the second switch 140 is electrically connected to the second input L, and the other terminal thereof is electrically connected to the second current-limiting component 142. One terminal of the second voltage-stabilizing component 148 is electrically connected to the gate of the second power switch 102, and the other terminal is connected to ground. The second capacitor 156 is electrically connected to the second voltage-stabilizing component 148 in parallel. The second resistor network 144 is arranged between the second current-limiting component 142 and the second voltage-stabilizing component 146 and electrically connected thereto. The second resister network 144 includes a plurality of resistors 150-156, and the resistor 156 thereof is electrically connected to the second voltage-stabilizing component 148 in parallel. The second voltage-stabilizing component 148 is, for example, a Zener diode, and the breakdown voltage of the second voltage-stabilizing component 148 is equal to or higher than the conducting voltage (the gate to source voltage) of the second power switch 102.

In practice, the first switch 120 turns on to conduct the neutral voltage VSN from the first input N to the first voltage-detecting unit 12 when the neutral voltage VSN supplies normally, and the second switch 140 turns on to conduct to the live voltage VSL from the second input L to the second voltage-detecting unit 14 when the live voltage VSL supplies normally.

The neutral voltage VSN conducted by the neutral line enters the first resistor network 124 after passing through the first current-limiting component 122, and a divided voltage is generated at the node connected between the resistors 134 and 136. The first power switch 100 turns on while the divided voltage is equal to or higher than the breakdown voltage of the first voltage-stabilizing component 128 since the gate to source voltage of the first power switch 100 is equal to the voltage drop across the first voltage-stabilizing component 128 and the breakdown voltage of the first voltage-stabilizing component 100 preset is equal to or high than the conducting voltage of the first power switch 100.

In the same way, the live voltage VSL conducted by the live line enters the second resistor network 144 after passing through the second current-limiting component 142, and another divided voltage is generated at the node connected between the resistors 154 and 156. The second power switch 102 turns on while the divided voltage is equal to or higher than the breakdown voltage of the second voltage-stabilizing component 148 since the gate to source voltage of the second power switch 102 is equal to the voltage drop across the second voltage-stabilizing component 148 and the breakdown voltage of the second voltage-stabilizing component 148 preset is equal to or high than the conducting voltage of the second power switch 102.

Briefly, the first power switch 100 turns on when the neutral voltage VSN supplies normally, and the second power switch 102 turns on when the live voltage VSL supplies normally. Contrarily, the first power switch 100 turns off when the neutral voltage VSN supplies abnormally, and the second power switch 102 turns off when the live voltage VSL supplies abnormally.

Figure 2:
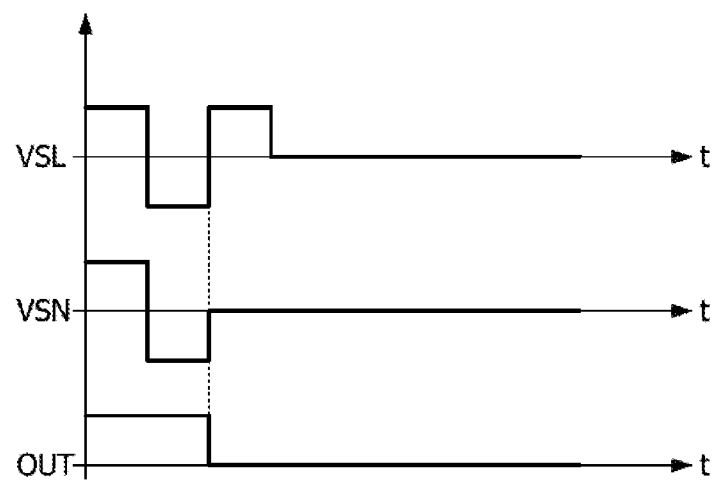
FIG. 2 is a waveform chart illustrating the voltages provided by the live line, neutral line, and the signal sent from the output of the present invention.

When the neutral voltage VSN conducted by the neutral line and the live voltage VSL conducted by the live line supply normally, both of the first power switch 100 and the second power switch 102 are turned on to light the light emitter 1060. After that, the photodetector 1062 receives the light emitted by the light emitter 1060 and generated the signal with high potential level for indicating that the neutral voltage VSN and live voltage VSL of the AC power Vs supplies normally, and the signal with high potential level for indicating that the AC power Vs supplies normally is then transmitted to the output OUT. Referred is made to FIG. 2, which shows the waveform of the voltages provided by the live line (the live voltage) and neutral line (the neutral voltage), and the signal sent from the output OUT.

On the contrary, the output OUT sends the signal with low potential level when one of the neutral voltage VSN conducted by the neutral line and the live voltage VSL conducted by the live line provides voltage supplies abnormally. Specifically, when the neutral voltage VSN supplies abnormally even if the live voltage VSL supplies normally, the first power switch 100 turns off, thereby the light emitter 1060 cannot be lit and the signal with low potential level is then generated since there is no light enters the photodetector 1062; moreover, when the live voltage VSL supplies abnormally even if the neutral voltage VSN supplies normally, the second power switch 102 turns off, thereby the light emitter 1060 cannot be lit, and the signal with low potential level is then generated since there is no light enters the photodetector 1062.

The output OUT further sends the signal with low potential level for indicating the AC power Vs supplies abnormally when both of the neutral voltage VSN and the live voltage supply abnormally. Specifically, the first power switch 100 turns off when the neutral voltage VSN supplies abnormally, and the second power switch 102 turns off when the live voltage VSL supplies abnormally, thereby the light emitter 1060 cannot be lit, and no light enters the photodetector 1062. Thus the signal with low potential level for indicating the AC power Vs supplies abnormally is sent from the output OUT.

The detail operating data of the neutral voltage conducted by the neutral line and the live voltage conducted by the live line, and the signal sent by the output OUT of the AC input voltage detecting device are shown in Table 1 below.

TABLE 1

|  | Neutral voltage supplies abnormally | Neutral voltage supplies normally |
|---|---|---|
| Live voltage supplies abnormally | the signal for indicating that the AC power supplies abnormally is sent by the output | the signal for indicating that the AC power supplies abnormally is sent by the output |
| Live voltage supplies normally | the signal for indicating that the AC power supplies abnormally is sent by the output | the signal for indicating that the AC power supplies normally is sent by the output |

In sum, the AC input voltage detecting device of the present invention detects the neutral voltage VSN conducts by the neutral line and the live voltage VSL conducts by the live line together, and generates the signal for indicating that the AC power Vs supplies normally only when the neutral voltage VSN and the live voltage VSL supply normally. Thus the incorrect operation caused by signal indicating that the AC power Vs supplies normally when one of the neutral voltage VSN and the live voltage VSL supplies abnormal is effectively prevented.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. An alternating current (AC) input voltage detecting device electrically connected to an AC power comprising:
   a first input electrically connected to a neutral line of the AC power;
   a second input electrically connected to a live line of the AC power;
   a determining unit comprising a first power switch, a second power switch, an output, a photo-coupler, and two current-limiting resistors, the first power switch and the second power switch electrically connected in series, and the output coupled to the second power switch, wherein the photo-coupler comprises a light emitter and a photodetector coupled to the light emitter, the light emitter is electrically connected to one of the current-limiting resistors connected to the second power switch, and the photodetector is electrically connected to the output and the other current-limiting resistor;
   a first voltage-detecting unit electrically connected to the first input and the first power switch; and
   a second voltage-detecting unit electrically connected to the second input and the second power switch,
   wherein a signal for indicating that the AC power supplies normally is generated by the determining unit and sent from the output while a live voltage conducted by the live line and a neutral voltage conducted by the neutral line are normal.

2. The AC input voltage detecting device of claim 1, wherein the determining unit generates a signal for indicating that the AC power supplies abnormally when at least one of the neutral voltage conducted by the neutral line and the live voltage conducted by the live line is abnormal.

3. The AC input voltage detecting device of claim 1, wherein when the live voltage conducted by the live line and the neutral voltage conducted by the neutral line are normal, the first power switch and the second power switch turn on to make the light emitter light, the photodetector received the light emitted by the light emitter and the signal for indicating that the AC power supplies normally is sent from the output.

4. The AC input voltage detecting device of claim 3, wherein the first voltage-detecting unit comprises a first current-limiting component, a first resistor network, and a first voltage-stabilizing component, the first current-limiting component is electrically connected to the first resistor network, the first voltage-stabilizing component is electrically connected to the first resistor network and the first power switch, the second voltage-detecting unit comprises a second current-limiting component, a second resistor network, and a second voltage-stabilizing component, the second current-limiting component is electrically connected to the second resistor network, and the second voltage-stabilizing component is electrically connected to the second resistor network and the second power switch.

5. The AC input voltage detecting device of claim 4, wherein the first voltage-detecting unit further includes a first switch arranged between the first input and the first current-limiting component and electrically connected to the first input and the first current-limiting component, and the second voltage-detecting unit further comprises a second switch arranged between the second input and the second current-limiting component and electrically connected to the second input and the second current-limiting component.

6. The AC input voltage detecting device of claim 5, wherein the first voltage-detecting unit further comprises a first capacitor electrically connected to the first voltage-stabilizing component in parallel, and the second voltage-detecting unit further comprises a second capacitor electrically connected to the second voltage-stabilizing component in parallel.

7. The AC input voltage detecting device of claim 4, wherein the first resistor network and the second resistor network respectively comprises a plurality of resistors, one of the resistors of the first resistor network is electrically connected to the first voltage-stabilizing component in parallel, and one of the resistors of the second resistor network is electrically connected to the second voltage-stabilizing component in parallel.

8. The AC input voltage detecting device of claim 4, wherein the first voltage-detecting unit further comprises a first capacitor electrically connected to the first voltage-stabilizing component in parallel, and the second voltage-detecting unit further comprises a second capacitor electrically connected to the second voltage-stabilizing component in parallel.

* * * * *